United States Patent
Hollaender et al.

(10) Patent No.: US 12,446,146 B2
(45) Date of Patent: Oct. 14, 2025

(54) RADAR SYSTEM

(71) Applicant: Robert Bosch GmbH, Stuttgart (DE)

(72) Inventors: Christian Hollaender, Rheinstetten (DE); Gustav Klett, Moessingen (DE); Klaus Baur, Mietingen (DE); Benjamin Josef Schaefer, Kirchheim/Teck (DE); David Kemmer, Esslingen (DE); Minh Nhat Pham, Leinfelden-Echterdingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 333 days.

(21) Appl. No.: 18/175,645

(22) Filed: Feb. 28, 2023

(65) Prior Publication Data

US 2023/0319981 A1    Oct. 5, 2023

(30) Foreign Application Priority Data

Apr. 1, 2022    (DE) .................. 10 2022 203 285.3

(51) Int. Cl.
*H05K 1/02* (2006.01)
*H01Q 1/24* (2006.01)

(52) U.S. Cl.
CPC ............. *H05K 1/0243* (2013.01); *H01Q 1/24* (2013.01); *H05K 2201/10098* (2013.01); *H05K 2201/10303* (2013.01)

(58) Field of Classification Search
None
See application file for complete search history.

(56) References Cited

U.S. PATENT DOCUMENTS

| | | | |
|---|---|---|---|
| 7,210,969 B1* | 5/2007 | Hashimoto | H05K 3/308 439/82 |
| 2003/0107881 A1* | 6/2003 | Muramatsu | H05K 9/0028 361/818 |
| 2006/0245145 A1* | 11/2006 | Wada | H04B 1/3816 361/600 |
| 2021/0083372 A1* | 3/2021 | Chase | H01Q 1/44 |
| 2021/0399402 A1* | 12/2021 | Chou | H01Q 1/1264 |
| 2022/0222501 A1* | 7/2022 | Forster | G06K 7/10297 |
| 2022/0239016 A1* | 7/2022 | Manser | H01Q 1/526 |
| 2023/0130508 A1* | 4/2023 | Hobbs | H01Q 9/0421 343/700 MS |
| 2024/0136723 A1* | 4/2024 | Garcia Tejero | H01Q 13/0275 |

* cited by examiner

*Primary Examiner* — Wilson Lee
(74) *Attorney, Agent, or Firm* — NORTON ROSE FULBRIGHT US LLP

(57) ABSTRACT

A radar system, which includes an antenna for sending and/or receiving radar signals and a circuit board including at least one high-frequency component and an element for sending and/or receiving high-frequency signals. The antenna includes at least one press-in pin, which is introduced into the antenna. At least one sleeve is situated on/at the circuit board, into which the press-in pin is inserted. The at least one press-in pin cooperates with the at least one sleeve in such a way that, when the antenna is being pushed onto the circuit board, the press-in pin is pressed into the at least one sleeve and deforms, providing fixation.

5 Claims, 3 Drawing Sheets

RADAR SYSTEM

CROSS REFERENCE

The present application claims the benefit under 35 U.S.C. § 119 of German Patent Application No. DE 10 2022 203 285.3 filed on Apr. 1, 2022, which is expressly incorporated herein by reference in its entirety.

FIELD

The present invention relates to a radar system, including an antenna for sending and/or receiving radar signals; and a circuit board including at least one high-frequency component and an element for sending and/or receiving high-frequency signals.

The circuit board may, for example, be an interposer.

BACKGROUND INFORMATION

Autonomous and semi-autonomous vehicles are controlled with the aid of at least one sensor system, which detects the surroundings of the vehicle. In the process, for example, a parking spot, a course of a road, other road users or obstacles are recognized and/or driving trajectories are determined or corresponding control commands are calculated as a function of the sensor data of the sensor system, the control commands being forwarded to actuators in the vehicle. In the process, not only comfort functions, such as adaptive cruise control, but also safety functions, such as, for example, emergency braking assistants, are implemented in vehicles. In the process, in particular, radar sensors are used. The essential advantage of such sensors is the direct measurement of physical variables, and not the interpretation of images which are recorded, for example, with the aid of a video camera.

Radar sensors emit high-frequency radar beams via an antenna structure, and receive beams reflected on objects. The detected objects may be stationary or moving in the process. With the aid of the received radar beams, it is possible to calculate the distance and the direction (angle) in relation to the object. Moreover, the relative velocity of the object in relation to the radar sensor may be calculated. Typical radar sensors operate in a frequency range between 76 GHz and 81 GHz.

Waveguide antennas are increasingly used as antennas. The antennas typically include plastic structures in which waveguide structures are formed. The integration, i.e., the positioning and attachment of such waveguide antennas, usually takes place by manufacturing methods such as soldering, adhesive bonding or screwing.

SUMMARY

According to an example embodiment of the present invention, the antenna includes at least one press-in pin. The at least one press-in pin is a retaining pin, which is preferably made of metal. The at least one press-in pin is introduced into the antenna, and is thus at least partially formed within the antenna, in particular, within a plastic structure of the antenna. Moreover, at least one sleeve is provided, which is situated on and/or at the circuit board. When the antenna is being mounted onto the circuit board, the at least one press-in pin is inserted into the at least one sleeve in an accurately fitting manner and is then pressed in. In the process, the at least one press-in pin deforms in the at least one sleeve, and the at least one press-in pin and the at least one sleeve form a fixation for the antenna at the circuit board. The at least one sleeve thus serves as a counter piece for pressing in the at least one press-in pin and may also be referred to as a press-in sleeve.

The press-in technique using press-in pins is already being used for the establishment of electrical connections between the circuit board and electrical plugs. When this technique is employed for mounting waveguide structures on the circuit board, the position of the antenna relative to the element for sending and/or receiving high-frequency signals is predefined by the position of the sleeves formed in the circuit board. The number and the position of the sleeves preferably correspond to the number and position of the press-in pins. Due to the force fit of the at least one press-in pin in the at least one sleeve, and possibly due to diffusion processes, which establish an intermetallic connection between the at least one press-in pin and the metallic lining of the at least one sleeve, a secure retention of the antenna on the circuit board is achieved. The press-in technique is a cost-effective standard method which establishes a permanent and high-quality joint between the antenna and the circuit board. Compared to other manufacturing methods, such as, e.g., soldering, adhesive bonding or screwing, this method offers advantages with respect to the costs, the required space, and the quality, and offers options for fabrication in established processes customary in the industry.

According to an example embodiment of the present invention, it is furthermore advantageous that the at least one press-in pin may be used for lateral positioning during the joining process. Usually, additional pins, typically made up of plastic, are used for laterally positioning the antenna, which may be dispensed with. In this way, space may be saved on the circuit board and in the antenna. The lateral tolerances are determined by the tumbling circle of each press-in pin, the deviation in the tumbling circle being caused by a tilting and/or by a position tolerance. In the case of the press-in technique, the tumbling circles are already very small. Added to this are very low tolerances during etching and/or when soldering the high-frequency component onto the circuit board.

The axial tolerances may be compensated for in that the length of the at least one press-in pin which is available for pressing-in may be greater than the length of the at least one sleeve. In this way, the at least one press-in pin, even with an axial offset between the antenna and the circuit board, extends far enough into the at least one sleeve to be fixed thereto.

Combined, the tolerances between the element for sending and/or receiving high-frequency signals and the waveguide are in a range of less than 0.1 mm.

According to an example embodiment of the present invention, the antenna includes plastic structures which are, in particular, made of multiple layers of plastic molded parts (also referred to as plastic injection molded part), i.e., plastic parts manufactured by injection molding. The at least one press-in pin may be introduced into the antenna by being introduced, while the antenna is being manufactured, during the injection molding process and being injection-molded with the plastic material in a form-locked manner. During a subsequent coating of the antenna with a conductive material, typically a metal, the area in which the at least one press-in pin is situated is advantageously masked so that no additional coating is applied onto the at least one press-in pin.

As an alternative, the at least one press-in pin may also be enclosed in the plastic structure of the antenna after the molding process (and after the coating process). For this purpose, at least one receptacle may be kept clear for the at least one press-in pin in the plastic structure.

According to an example embodiment of the present invention, preferably at least two press-in pins are provided to achieve a secure positioning and attachment of the antenna on the circuit board. Advantageously, the at least two press-in pins are positioned in the feeding area of the antenna, in which the radar waves are fed into the antenna. In this way, the antenna is firmly fixed in this relevant area, and the tolerances there are kept as small as possible.

As an alternative or in addition, at least one press-in pin may be positioned at the outer edge of the antenna. In this connection, "at the outer edge" means not only directly on the outer edge, but also in an area around the outer edge. As a result of the positioning at the outer edge, the stability and the stiffness of the joint between the antenna and the circuit board are increased. Optionally, a press-in pin may in each case be positioned at each corner of the antenna.

According to an example embodiment of the present invention, preferably, at least two press-in pins are provided in the feeding area, and at least one further press-in pin is provided at the outer edge, preferably one press-in pin in each corner, of the antenna. In this way, the two aforementioned advantages are combined.

BRIEF DESCRIPTION OF THE DRAWINGS

Exemplary embodiments of the present invention are shown in the figures and are described in greater detail in the following description.

DETAILED DESCRIPTION OF EXAMPLE EMBODIMENTS

Figure 1:
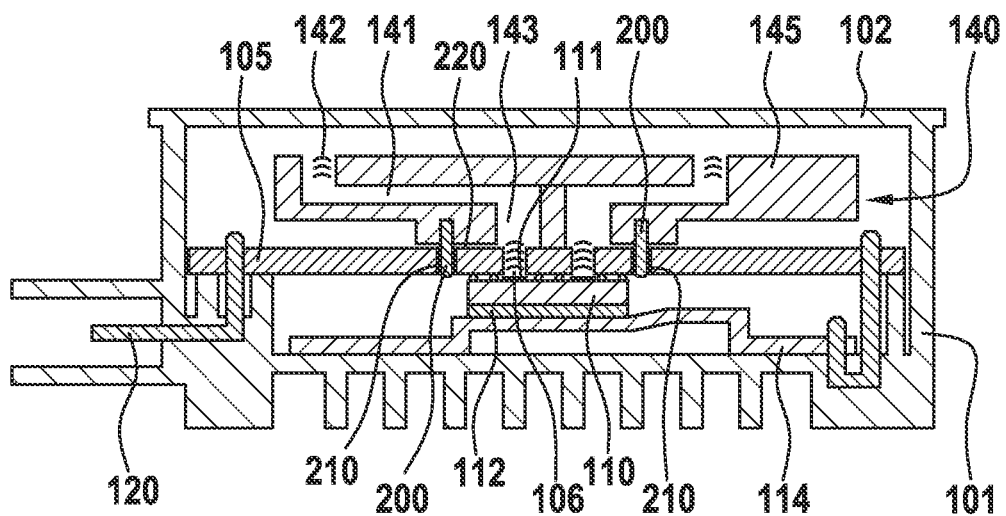
FIG. 1 shows a cross-sectional view from the side through a radar system according to an example embodiment of the present invention.

FIG. 1 shows a radar system for surroundings detection of a motor vehicle in a cross-sectional view from the side. This radar system includes a housing 101, which is closed off at the front side by a radome 102. A circuit board 105, at which a high-frequency component 110, which, for example, is designed as a monolithic microwave integrated circuit (MMIC), is formed, is situated in housing 101. High-frequency component 110 is connected via a layer of thermal interface materials (TIM) 112 to a cooling element 114 for heat dissipation. Plug elements 120 connect the switching device situated on the circuit board to lines accessible from the outside, and the like. High-frequency component 110 includes launchers 111, with the aid of which radar waves may be coupled into an antenna 140. High-frequency component 110 including launchers 111 is situated at the rear side/underside of circuit board 105 in this example, and sends the radar waves through an opening 106 in circuit board 105. High-frequency component 110 including launchers 111 may also be situated on the front side/upper side of circuit board 105, or, alternatively, other concepts including structures on the front side and/or on the rear side of circuit board 105 may be used.

Antenna 140 is implemented as a waveguide antenna here, as is schematically shown in FIG. 1. Antenna 140 includes multiple waveguides 141, which are formed in multiple layers of plastic injection-molded parts 145. Waveguides 141, in the emission direction, include emitting elements 142, for example in the form of slots, and toward circuit board 105 include a feeding area 143. During operation, radar waves are coupled by launchers 111 into feeding area 143 of waveguide 141 and are guided through waveguide 141 to emitting elements 142, where they are then emitted.

Antenna 140 moreover includes multiple press-in pins 200, which have been introduced into plastic injection-molded parts 145. Circuit board 105 includes multiple press-in sleeves 210, the number and the position of sleeves 210 being provided in a manner matching press-in pins 200. During mounting, antenna 140 is placed onto circuit board 105 and, in the process, press-in pins 200 are pressed into the corresponding sleeves 210 on circuit board 105. As a result of the pressing-in, press-in pins 200 deform, and a fixation is created, with the aid of which antenna 140 is fixed on circuit board 105.

As shown in FIG. 1, an air gap 220 may arise between antenna 140 and circuit board 105. This air gap 220 is kept as small as possible to achieve an effective coupling/decoupling of the radar waves in feeding area 143 of waveguide 141. To compensate for larger air gaps 220, additional structures may be introduced into the feeding area on circuit board 105, for example by etching in copper, and/or in feeding area 143 of waveguides 141, for example with the aid of 3D structuring. In this way, air gaps 220 up to approximately 0.4 mm are bridgeable.

Figure 2:
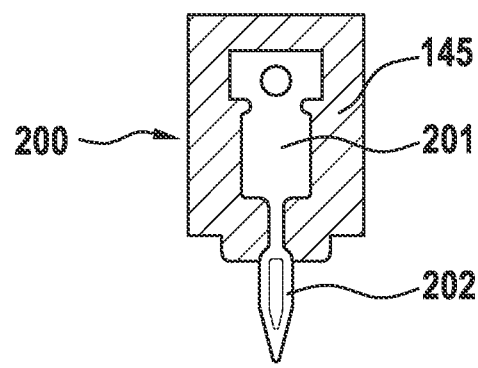
FIG. 2 shows a cross-section from the side through a press-in pin in a plastic part, according to an example embodiment of the present invention.

FIG. 2 shows a press-in pin 200, which is designed in needle eye technique. However, other techniques may also be used, for example a rigid press-in pin. Press-in pin 200 is introduced during an injection molding process, an attachment area 201 being injection-molded by plastic part 145 of antenna 140 in a form-locked manner, by which press-in pin 200 is fixed in antenna 140. A flexible spring area 202 is left exposed during the injection molding process and protrudes from plastic part 145. During mounting, flexible spring area 202 is pressed into sleeve 210. Spring area 202 is designed to be longer than sleeve 210 so that spring area 202 also engages in sleeve 210 when air gap 220 occurs. When antenna 140 is pushed onto circuit board 105, spring area 202 deforms and establishes a fixation in sleeve 210.

Figure 3A:
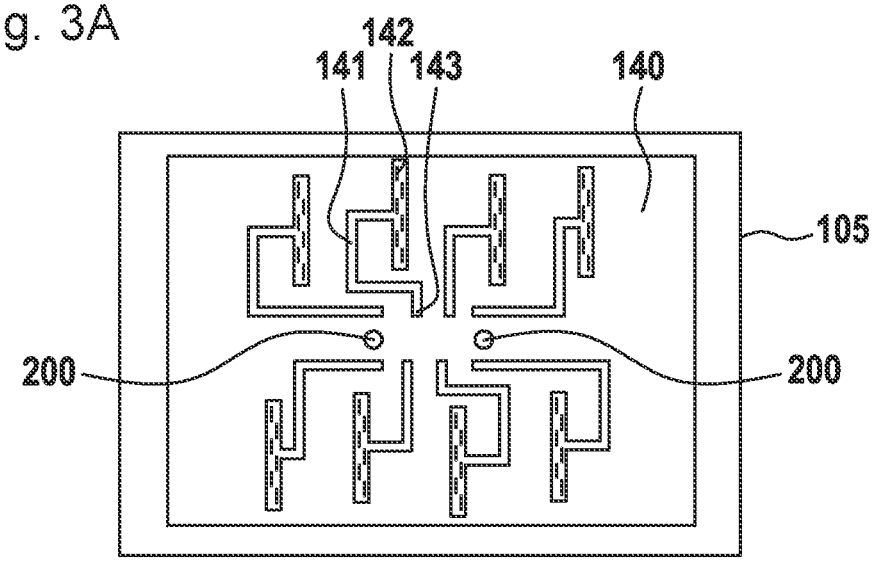
FIGS. 3A through 3D each show a sectional view from above onto the radar system according to an example embodiment the present invention with different positions of the press-in pins.
Figure 3B:
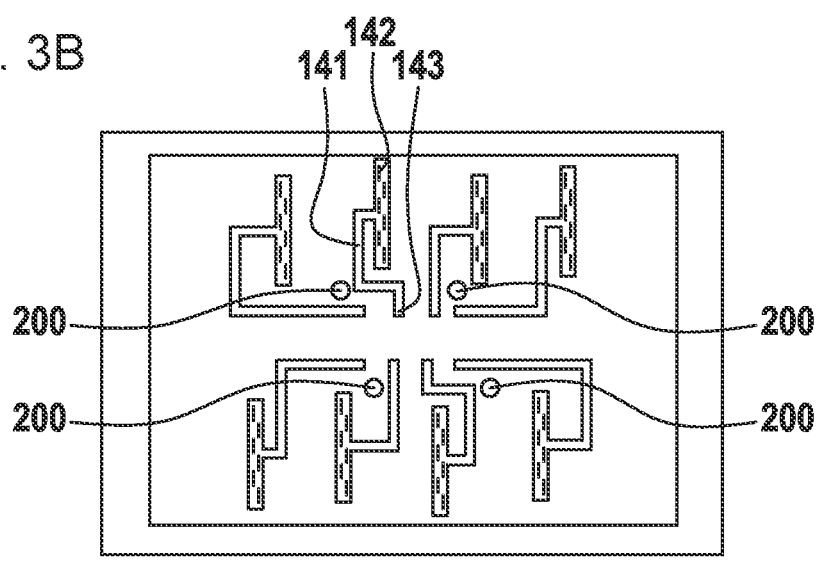
Figure 3C:
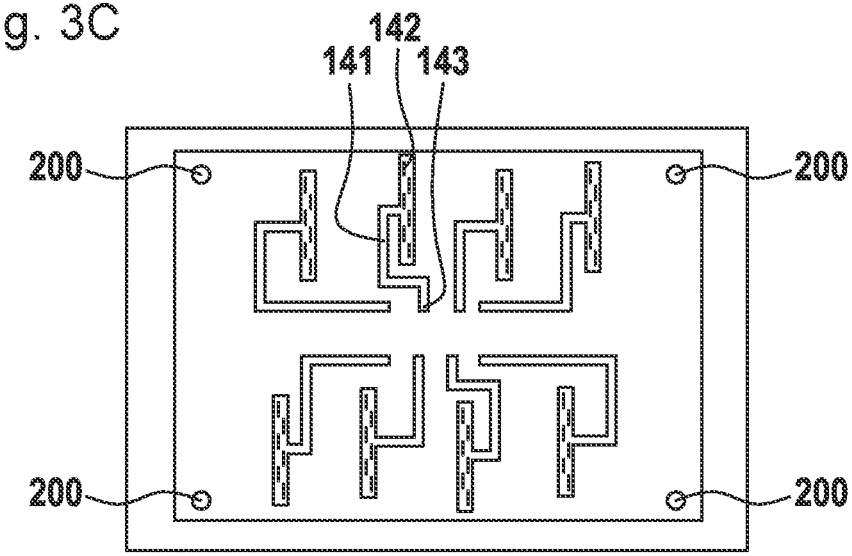
Figure 3D:
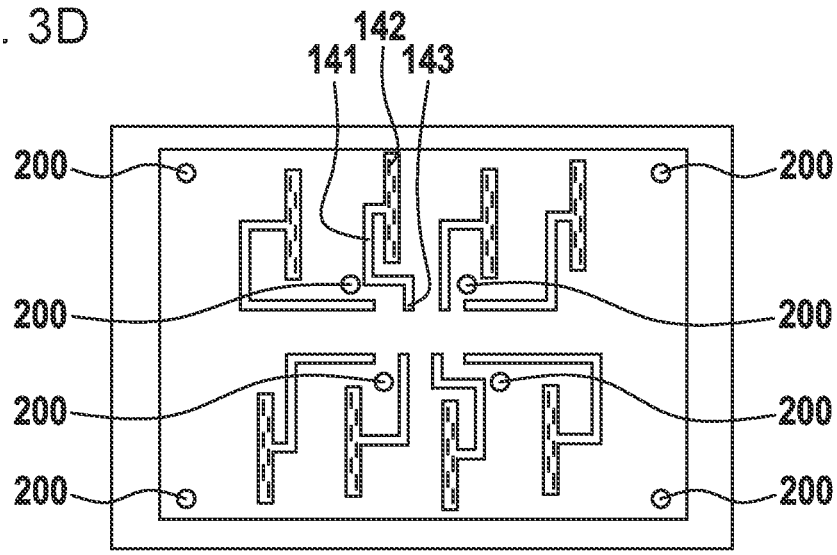

FIGS. 3A through 3D show, in cross-sectional views from above, various positionings for press-in pins 200 in antenna 140 (and correspondingly for sleeves 210, which are not shown here, in circuit board 105). Identical components are denoted by the same reference numerals, and their renewed description is dispensed with. Additionally, for the sake of clarity, reference numerals are only indicated for one of waveguides 141 including emitting element 142 and feeding area 143. FIG. 3A shows two press-in pins 200 in the feeding area of the radar waves in which launchers 111 are positioned, i.e., close to feeding areas 143 of waveguides 141. In this way, a good fixation, with minimal tolerance in the feeding area, is already achieved with only two press-in pins 200. In FIG. 3B, four press-in pins 200 are provided in the feeding area of the radar waves, thereby further increasing the stability compared to two press-in pins 200. In FIG. 3C, four press-in pins 200 are situated close to the outer edge of antenna 140. In the present rectangular antenna 140, a respective press-in pin 200 is positioned in each of its corners. In this way, the stability and the stiffness of the radar system are increased. In FIG. 3D, both four press-in pins 200 are provided in the feeding area, and four press-in pins 200 are also provided near the outer edge, in the corners of antenna 140. In this way, good fixation, with little tolerance in the feeding area, is combined with high stability and stiffness.

What is claimed is:

1. A radar system, comprising:
a waveguide antenna configured to send and/or receive radar signals; and
a circuit board including at least one high-frequency component and an element configured to send and/or receive high-frequency signals;
wherein:
the antenna includes at least one press-in pin, wherein the at least one press-in pin is at least partially formed within the antenna,
at least one sleeve is situated on/at the circuit board, into which the press-in pin is inserted; and
the at least one press-in pin cooperates with the at least one sleeve in such a way that, when the antenna is being pushed onto the circuit board, the press-in pin is pressed into the at least one sleeve and deforms, such that the at least one press-in pin fixes the antenna to the circuit board.

2. The radar system as recited in claim 1, wherein a length of the at least one press-in pin which is available for pressing-in is greater than a length of the at least one sleeve.

3. The radar system as recited in claim 1, wherein the at least one press-in pin is injection-molded in a plastic injection-molded part of the antenna in a form-locked manner.

4. The radar system as recited in claim 1, wherein the at least one press-in pin includes at least two press-in pins which are positioned in a feeding area of the antenna.

5. The radar system as recited in claim 4, wherein at least one of the press-in pins is positioned at an outer edge of the antenna.

* * * * *